United States Patent [19]

Carpenter et al.

[11] 4,129,864

[45] Dec. 12, 1978

[54] HIGH SPEED, WIDE DYNAMIC RANGE ANALOG-TO-DIGITAL CONVERSION

[75] Inventors: Robert J. Carpenter; Kenneth W. Yee, both of Rockville, Md.

[73] Assignee: The United States of America as represented by the Secretary of Commerce, Washington, D.C.

[21] Appl. No.: 848,041

[22] Filed: Nov. 3, 1977

Related U.S. Application Data

[62] Division of Ser. No. 663,401, Mar. 3, 1976, Pat. No. 4,069,479.

[51] Int. Cl.² ............................................. H03K 13/02
[52] U.S. Cl. .............................. 340/347 AD; 324/115; 340/347 M
[58] Field of Search .................... 340/347 AD, 347 M; 324/99 D, 115

[56] References Cited

U.S. PATENT DOCUMENTS 3,467,958    9/1969    McKinney .................... 340/347 AD Primary Examiner—Thomas J. Sloyan
Attorney, Agent, or Firm—Eugene J. Pawlikowski; Alvin J. Englert

[57] ABSTRACT

A wide dynamic range, wide bandwidth, analog-to-digital conversion system and method. A plurality of overlapped analog-to-digital converters are utilized in conjunction with scaling amplifiers to provide a plurality of output ranges. Means for selecting the set of output bits which provides a magnitude representation of the input signal are provided along with means for outputting a digital representation of the appropriate range.

1 Claim, 5 Drawing Figures

HIGH SPEED, WIDE DYNAMIC RANGE ANALOG-TO-DIGITAL CONVERSION

This is a division of application Ser. No. 663,401 filed Mar. 3, 1976, now U.S. Pat. No. 4,069,479.

The present invention relates to a wide dynamic range, high speed, analog-to-digital conversion system and method.

In a wide variety of applications, unpredictable signals of wide dynamic range with frequency components up to hundreds of kilohertz are encountered. Capturing these signals for later analysis in digital systems presents a problem since high speed analog-to-digital converters ordinarily are limited to 10 or 12 bits of resolution. Thus, the signal amplitude must be accurately predicted if even 1 percent resolution is to be obtained, and in many cases this is not possible.

According to the conversion technique of the present invention, moderately priced analog-to-digital converters are utilized to obtain wide dynamic range without significant loss in speed. Resolution is increased by utilizing a plurality of overlapped converters in conjunction with scaling amplifiers to provide a plurality of output ranges. The result is analagous to the floating-point numerical representation used by data processors in that a number of bits are used to give the required resolution and sign, and a few more are appended to give the scale factor.

It is thus an object of the invention to provide a wide dynamic range, high speed analog-to-digital conversion system and method.

It is a further object of the invention to provide such a system utilizing relatively low cost components.

The invention will be better understood by referring to the accompanying drawings in which:

FIGS. 1 and 2 together show an embodiment of the analog-to-digital conversion system of the invention.

FIG. 1 shows a system for overlapping analog-to-digital converters for providing multiple ranges and FIG. 2 shows an output system for choosing the appropriate set of contiguous bits of the converters of FIG. 1 for the output.

Figure 1:
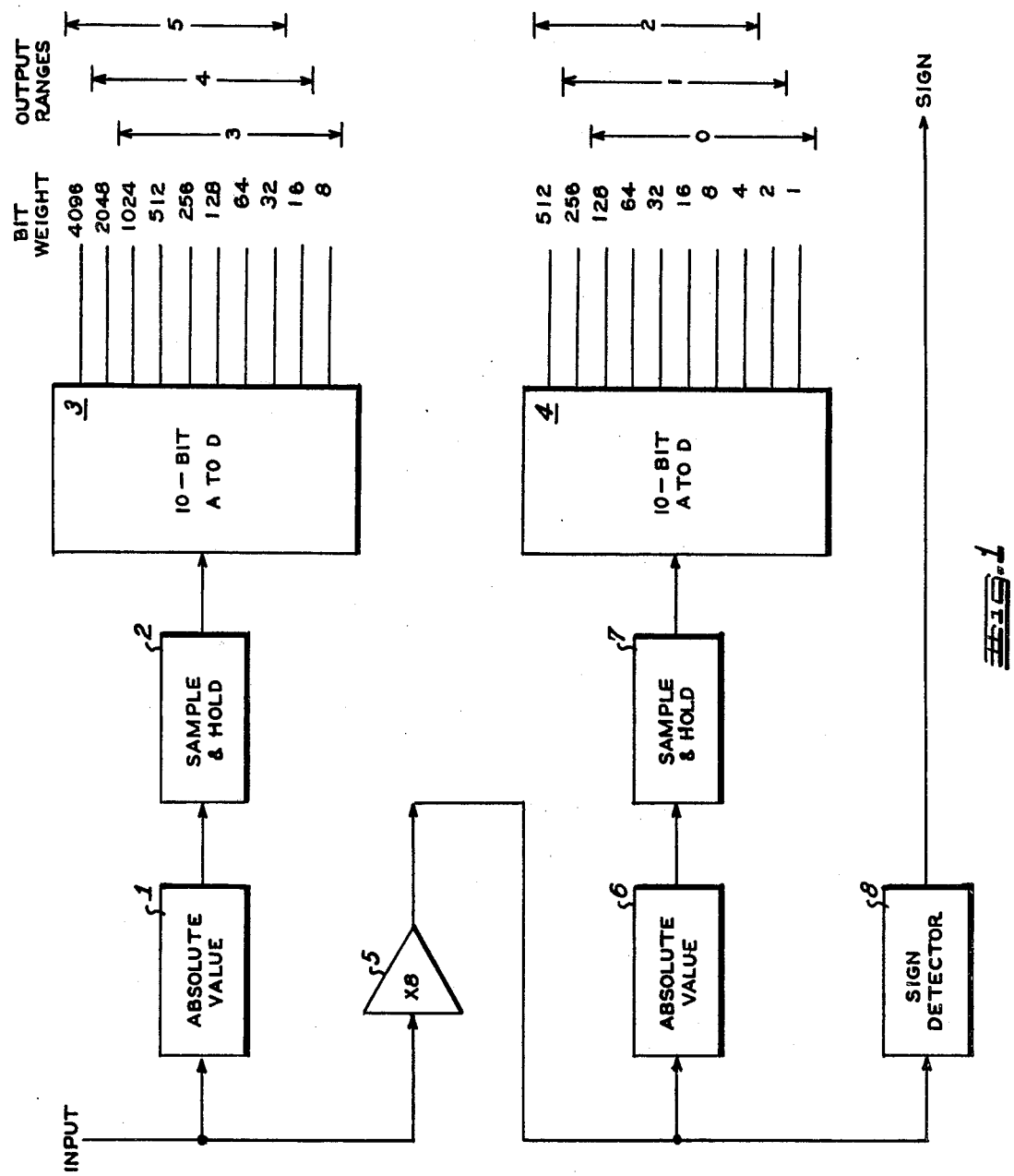
FIGS. 1 and 2 show an embodiment of the invention. More specifically.

Referring to FIG. 1, reasonably priced analog-to-digital converters with 1 microsecond conversion time are presently limited to 10 bits of resolution with 12 bits perhaps being available if 2 microseconds conversion time is available. According to the system shown in FIG. 1, greater resolution is achieved by using more than one analog-to-digital converter in conjunction with a scaling amplifier or amplifiers. Converters 3 and 4 are overlapped with the input signal being amplified by amplifier 5 before being inputted to lower output range analog-to-digital converter 4.

In the embodiment shown, each of the analog-to-digital converters is a 10 bit unipolar converter and ranges of 8 bit resolution are selected, making a total of six ranges, denoted by the numerals 0 to 5 in FIG. 1. Each converter added provides three additional 8 bit ranges. In the embodiment shown, the input signal is multiplied by 8 before being inputted to the lower range converter 4 and each output bit of converter 3 is assigned a weight 8 times that of the corresponding bit of converter 4.

The input signal is fed to absolute value taking network 1 and the amplified output signal is fed to absolute value taking network 6. Networks 1 and 6 convert the bi-polar input and amplified input signals to unipolar signals and the details of these units are known to those skilled in the art. The outputs of networks 1 and 6 are fed to sample and hold networks 2 and 7 respectively, which are necessary to maintain constant input signals to the converters during the conversion time to eliminate errors due to time uncertainty. In the illustrative embodiment, these circuits are arranged to sample every 2 microseconds, and as they suffer from limited dynamic range problems, they must be used directly before the elemental analog-to-digital converters at which point the required dynamic range is the same as that of the associated converter. The sign of the input signal is determined from the amplified signal by sign detector 8.

Figure 4:
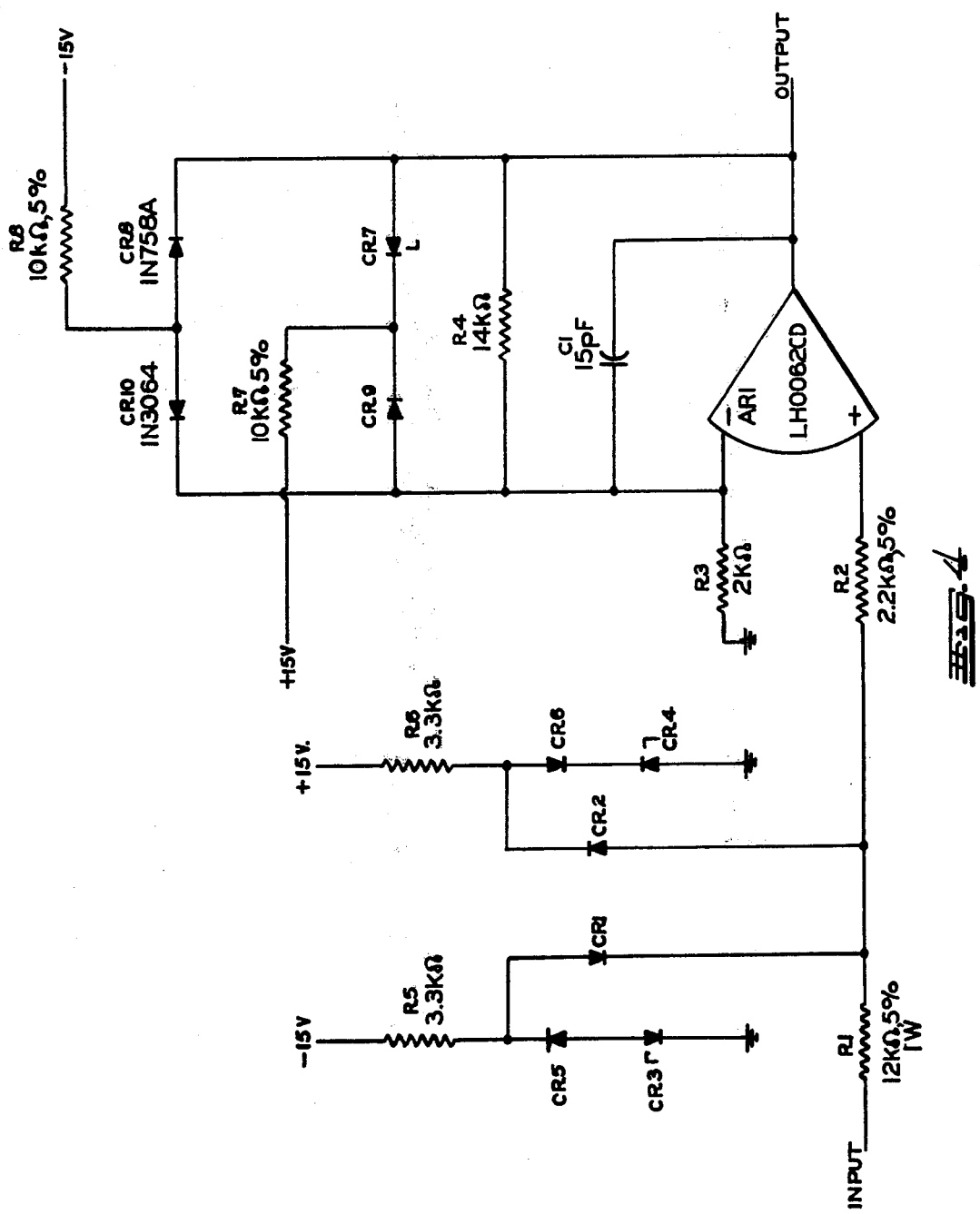
FIG. 4 is a schematic diagram of an amplification stage for use in the system of the invention.

The overall gain of amplifier 5 must be more accurate than the desired system accuracy, which in the illustrative embodiment is better than 0.5%. Further, when going from a full-scale signal on the unamplified converter, the amplifier must recover and settle to the new value within ±0.1% of the amplifier full scale within the sample period, and for this reason, controlled overload, rapid overload recovery, high slew rate, and fast settling time are required of the amplifier. A schematic diagram of an appropriate amplification stage is shown in FIG. 4 and is discussed below.

Figure 2:
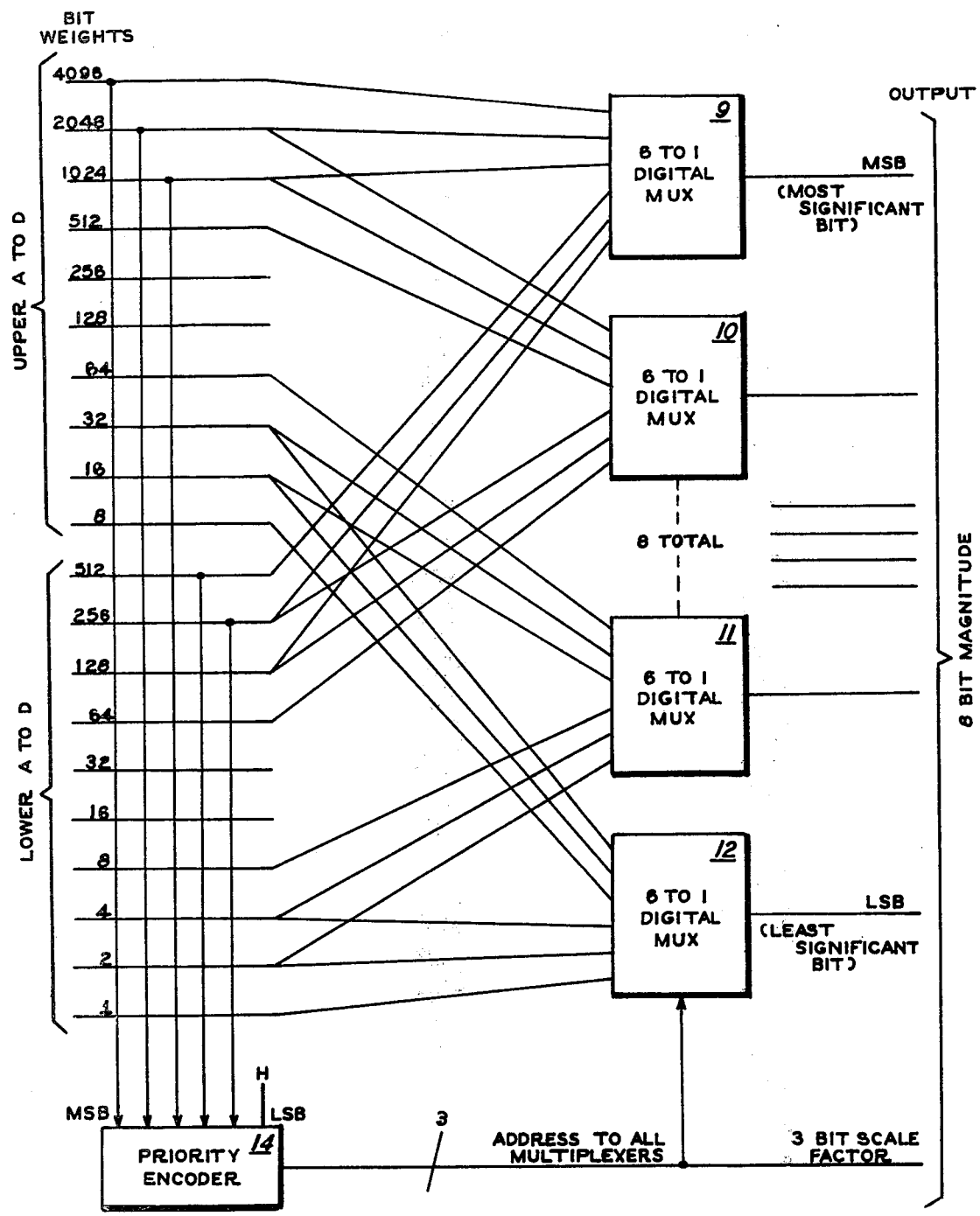

At the end of each 2 microsecond sample period a digital representation of the input voltage is available at the output bits of one of the converters. The object now is to choose which contiguous 8 bits to connect to the output of the system, and the circuitry shown in FIG. 2 is arranged to do this. Since sign-magnitude floating-point notation is used, the highest value "1" in the system should always be the most significant output bit. We may then merely examine the most significant bit of all the possible output sets to find the highest-valued bit which is a "1".

According to the arrangement of FIG. 2, an integrated circuit priority encoder is utilized to determine the most significant bit. Such an encoder is operative to deliver a binary coded output to indicate the highest-valued active input, which output is the scale factor of the floating-point output and is also used to drive the address inputs of data multiplexers to select the proper 8-bit group of magnitude bits.

Referring to the Figure, the inputs of priority encoder 14 are connected to the 4096, 2048, and 1024 outputs of upper range analog-to-digital converter 3 and to the 512, 256 and 128 outputs of lower range analog-to-digital converter 4. Eight digital multiplexers, four of which, 9, 10, 11 and 12, are shown, are provided and three contiguous outputs of each converter are connected to the inputs of each multiplexer with the highest bit weight output connected to each multiplexer being one lower than the highest bit weight connected to the multiplexer above it. Thus referring to FIG. 2, the 4096, 2048 and 1024 outputs of analog-to-digital converter 3 are connected to the inputs of multiplexer 9 along with the 512, 256 and 128 outputs of analog-to-digital converter 4. Inputted to the next lower digital multiplexer 10 are the 2048, 1024 and 512 outputs of analog-to-digital converter 3 along with the 256, 128 and 64 outputs of analog-to-digital converter 4, and so on for the remaining six digital multiplexers.

The priority encoder 14 determines the most significant bit of the system and addresses the digital multiplexers accordingly. Thus, for example, if the priority encoder determines the most significant bit to be 2048, then it addresses each of the digital multiplexers with the code for the second from the top input line and that is the signal read out by each digital multiplexer. The output of the system is thus an 8-bit code representative of the magnitude of the input.

Priority encoder 14 further is arranged to output the scale factor corresponding to the most significant bit, and the magnitude code in conjunction with the scale factor code indicates the magnitude of the input signal. For example, with the circuit of FIG. 2, the following magnitude and scale codes would be indicated:

| INPUT (arbitrary units) | OUTPUT CODE (base 2) | |
|---|---|---|
| | SCALE FACTOR | MAGNITUDE |
| 0 | 000 | 0000 0000 |
| 512 | 010 | 1000 0000 |
| 1024 | 011 | 1000 0000 |
| 8160 | 101 | 1111 1111 |

Figure 3:
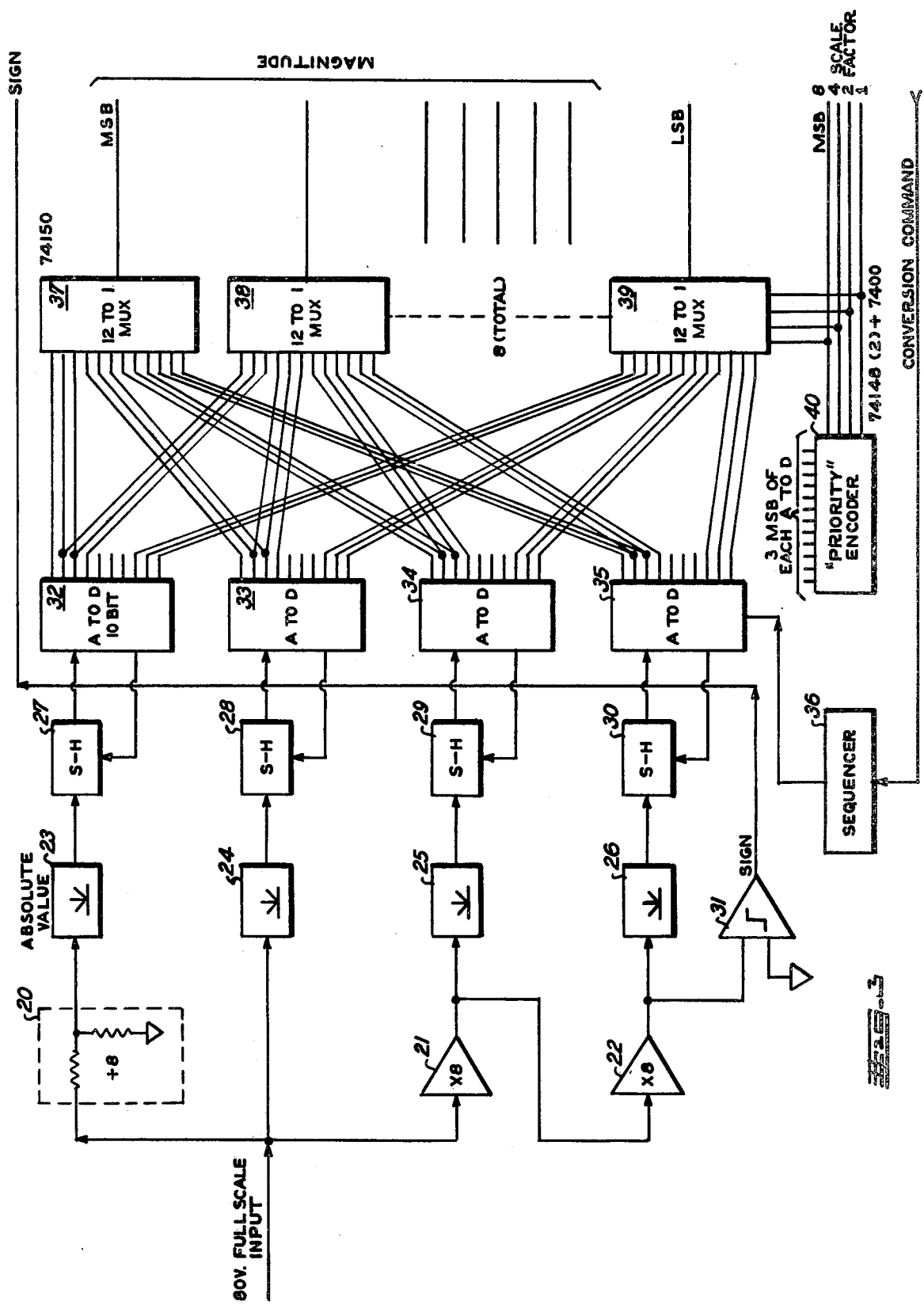
FIG. 3 is a diagram of a further embodiment of the invention having a greater number of ranges than the embodiment of FIGS. 1 and 2.

FIG. 3 shows essentially the same system illustrated in FIGS. 1 and 2 extended to cover a greater dynamic range. In this system four analog-to-digital converters 32, 33, 34 and 35 are used instead of the two used in the embodiment of FIGS. 1 and 2 and one divider 20 is used. As in the prior embodiment, eight digital multiplexers are used, and each multiplexer has 12 inputs. The inputs of priority encoder 40 are connected to the three most significant bits of each analog-to-digital converter.

Since d.c. coupling is required for fast overload recovery, problems due to the d.c. drift and noise in the most sensitive ranges may be encountered with the embodiment shown in FIG. 3. Full scale in this embodiment was defined as 80 volts but since analog-to-digital systems typically have 10 volts as full scale, an 8 to 1 attenuator was placed in the highest valued channel. Thus the total amplifier gain is 64 (8×8) rather than 512 (8×8×8) which would be required with a 10 volt full-scale input sensitivity. D.C. stability is better than one LSB on the most sensitive range with the system using wideband fast settling FET input integrated circuit amplifiers.

An examination of FIG. 3 will reveal that signals pass through different numbers of amplifiers depending on amplitude range. If the input is small, the output will be taken from the analog-to-digital converter which is fed through two amplifiers, but if the input is large, it will be taken from an unamplified channel. There is significant time delay in the amplifiers and for this reason, the hold commands for the various sample and hold circuits should be time skewed so that the outputs represent the input at a specific time, irrespective of the channel from which it is taken. A skew of about 200 nanoseconds per amplifier is typical in this bandwidth system. The data output from the multiplexers must be examined only during the period when all the elemental analog-to-digital converters have completed a conversion and before any converter starts again.

FIG. 4 is a schematic diagram of an amplification stage which may be used in the system of the invention. The amplification stage incorporates various features for ameliorating the effects of overloading. The input signal is clamped with switching diodes connected to 2 volt potentials regulated by diodes. In order to increase the interchangeability of system components, the amplifiers were designed without signal inversions. The gain is adjusted to the desired number (8 in the illustrative embodiment), by carefully trimming the ratio of R3 to R4 to be 1 to 7 within the acceptable error (0.2% was selected). The output voltage of the amplifier is limited by connecting biased diodes across the feedback resistor R4. The floating biases are obtained from Zener diodes referenced to the amplifier output voltage. This circuit does not actually eliminate amplifier overload, so amplifiers such as the LH0062, which recover within one microsecond, must be used.

Figure 5:
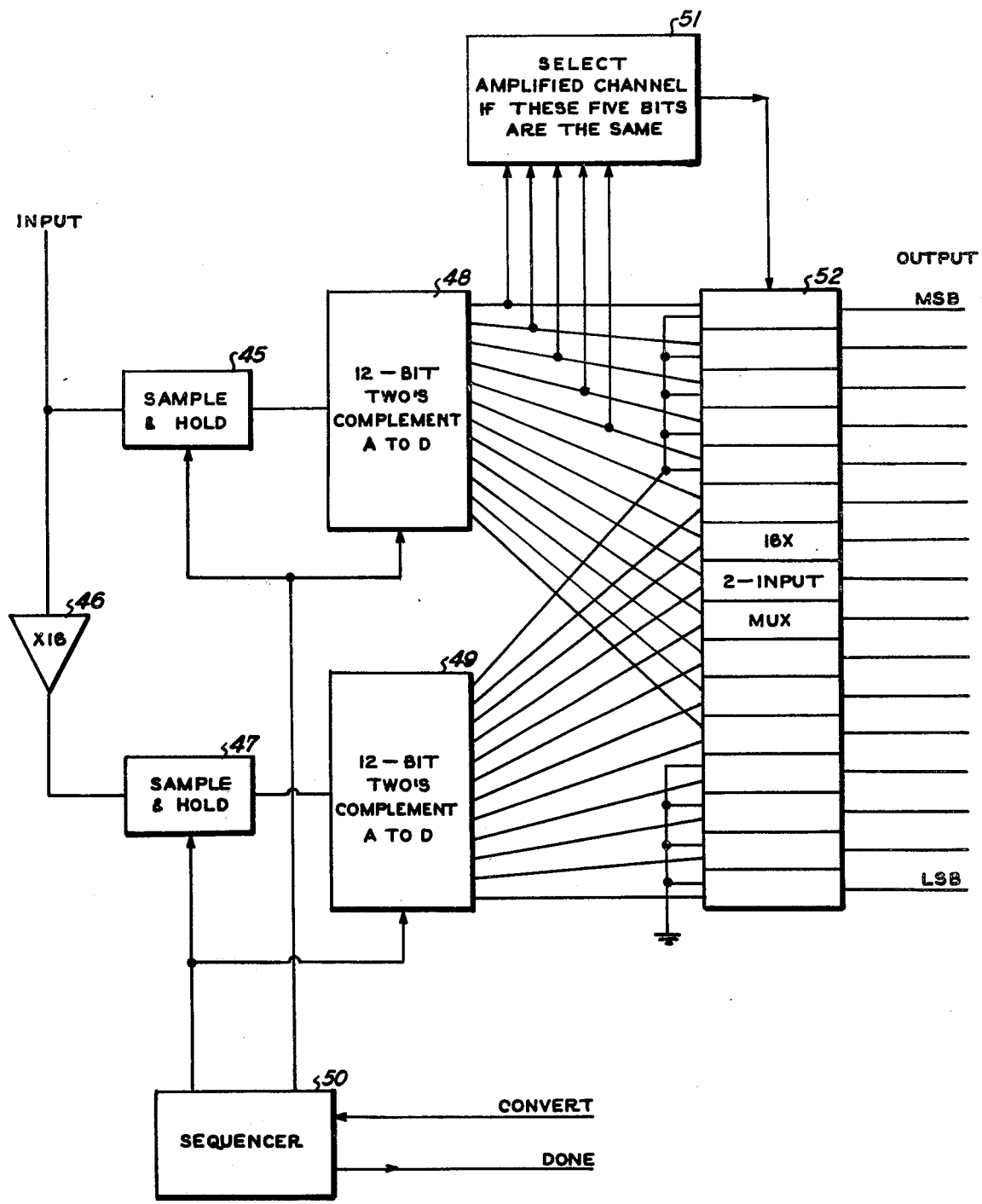
FIG. 5 is a diagram of a simplified two's complement system.

FIG. 5 shows a two's component analog-to-digital conversion system which is suitable for applications which do not need the wide range and bandwidth of the embodiments described above. The specific embodiment shown in FIG. 5 is illustrated for the case where an 8 bit two's complement representation is sufficiently accurate, but the amplitude range over which it must be maintained is 256 to 1.

Two 12 bit two's complement analog-to-digital converters 48 and 49 are overlapped by 8 bits (equivalent value bits offset by 4 bit positions) to give the required resolution for all values. The unamplified input is applied through sample and hold network 45 to analog-to-digital converter 48 while the input to analog-to-digital converter 49 is applied through amplifier 46 which has a gain of 16 since this is the ratio of the effective full-scale ranges of the two analog-to-digital converters. The sample and hold networks are sequentially activated by sequencer 50.

The output in FIG. 5 is arranged to be suitable for a 16-bit computer and it is placed in the 16-bit word appropriate to the input voltage so that no post-scaling is needed. The output is taken from multiplexer 52 to which the overlapped and non-overlapped analog-to-digital converter outputs are fed as shown in the Figure. The criterion for the selection of the correct digital information from the analog-to-digital converter outputs is that the output from the amplified channel is taken only if the first five bits of the unamplified channel are the same. Comparator 51 in FIG. 5 makes this determination and the digital outputs are selected accordingly.

Further, while we have described an illustrative embodiment of our invention, we wish it to be understood that we do not intend to be restricted solely thereto, but that we do intend to cover all modifications thereof which would be apparent to one skilled in the art and which come within the spirit and scope of our invention.

What is claimed is:

1. An analog-to-digital conversion system for outputting an N bit word, comprising,
    an input for receiving an analog input signal,
    a pair of two's complement analog-to-digital converters, one being a higher range converter and the other being a lower range converter, each converter having a resolution of K bits where K is a number which is smaller than N,
    a unit gain path between said input and said higher range converter,
    amplification means between said input and said lower range converter, said amplification means having a gain equal to the desired ratio of the full-scale ranges of said two converters, means for selecting said higher range converter when there are more than N-2(N-K) significant bits in its output and for otherwise selecting said lower range converter, and, means for providing an N bit output word which is comprised of the output bits of said selected converter and N-K higher output bits having the same level as the most significant bit of said lower range converter when said lower range converter is said selected converter, and which is comprised of the output bits of said selected converter and N-K lower output bits having a zero level when said higher range converter is said selected converter.

* * * * *